(12) United States Patent
Lerner et al.

(10) Patent No.: US 10,033,151 B2
(45) Date of Patent: Jul. 24, 2018

(54) LASER MODULE WITH MENISCUS COLLIMATING LENS

(71) Applicant: nLIGHT, Inc., Vancouver, WA (US)

(72) Inventors: Scott A. Lerner, Vancouver, WA (US); Raymond Kirk Price, Vancouver, WA (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 15/373,217

(22) Filed: Dec. 8, 2016

(65) Prior Publication Data

US 2017/0170629 A1    Jun. 15, 2017

Related U.S. Application Data

(60) Provisional application No. 62/267,678, filed on Dec. 15, 2015.

(51) Int. Cl.
*H01S 5/022* (2006.01)
*G02B 27/30* (2006.01)
*G02B 3/04* (2006.01)
*H01S 5/34* (2006.01)

(52) U.S. Cl.
CPC ............ *H01S 5/02288* (2013.01); *G02B 3/04* (2013.01); *G02B 27/30* (2013.01); *H01S 5/3401* (2013.01)

(58) Field of Classification Search
CPC ........ H01S 5/02288; G02B 27/30; G02B 3/04
See application file for complete search history.

(56) References Cited

U.S. PATENT DOCUMENTS

2010/0177621 A1* 7/2010 Wakabayashi ....... G11B 7/0956
369/112.23

OTHER PUBLICATIONS

Cogburn, G. et al., "Molding Aspheric Lenses for Low-Cost Production Versus Diamond Turned Lenses", Proceedings of SPIE; vol. 7660; Infrared Technology and Applications XXXVI, May 4, 2010; 6 pages.
Curatu, G. et al., "A novel technology based on CO2 lasers for surface finishing and direct fiber fusion of beam delivery optics", Proceedings of SPIE, vol. 7579, Laser Resonators and Beam Control XII, 2010, 5 pages.
Curatu, G. et al., "Using molded chalcogenide glass technology to reduce cost in a compact wide-angle thermal imaging lens", Proceedings of SPIE, vol. 6206, Infrared Technology and Applications XXXII, 2006, 8 pages.
http://www.thorlabs.com/newgrouppage9.cfm?objectgroup_id=4791; Feb. 22, 2018.
www.lightpath.com/literature/technicalPapers/coll.pdf; Feb. 22, 2018.

* cited by examiner

*Primary Examiner* — Dung Nguyen
(74) *Attorney, Agent, or Firm* — Green, Howard & Mughal LLP.

(57) ABSTRACT

Laser module including a meniscus collimating lens. In some embodiments, a monolithic material having an index of at least 2.0 provides a concave lens surface proximal to an emission surface of the laser and a convex lens surface distal from the emission surface. In some embodiments, a perimeter of the collimating lens has a face-flat that may be disposed directly against a reference surface while the concave lens surface is separated from the emission surface. The meniscus lens may advantageously provide reduced angle of ray incidence and require lower asphericity relative to a plano-convex collimating lens.

19 Claims, 8 Drawing Sheets

LASER MODULE WITH MENISCUS COLLIMATING LENS

CLAIM FOR PRIORITY

This application claims priority to U.S. Provisional Patent Application Ser. No. 62/267,678, filed on 15 Dec. 2015, titled "IR LASER MODULE WITH MENISCUS COLLIMATING LENS", and which is incorporated by reference in its entirety.

BACKGROUND

Semiconductor lasers find applications in industrial processing, consumer, and medical fields. Some of these applications employ lasers in the mid IR (3 μm-8 μm) and long IR band (8 μm-15 μm). For example, atmospheric monitoring and trace-gas optical detection target molecular absorption bands throughout the mid-to-long IR range of the electromagnetic spectrum. Many biomedical applications rely on water's strong absorption of the mid-IR range. Likewise, many polymer-processing applications rely on strong absorption of energy in the mid-IR range. Military applications such as IRCM also typically employ mid-wave IR.

Semiconductor Quantum cascade (QC) lasers are suitable as compact sources emitting at wavelengths over 3 μm. While having different modes of operation, both QC and interband semiconductor lasers are often associated with highly divergent, yet diffraction limited beam emission along at least one optical axis. Depending on the architecture of the semiconductor laser, beam waist divergence angle and associated beam quality may be symmetric, or asymmetric characterized with a slow and fast optical axis. Therefore, compact commercial semiconductor lasers are often sold as a system or module equipped with integrated collimation optics. Collimation optics may include one or more lens or mirror. For asymmetric sources with poor beam quality in one direction, collimation optics typically includes at least a fast axis collimator (FAC) to reduce strong divergence in the "fast" direction. High power quantum cascade lasers with excellent beam quality in both axes utilize radially symmetric collimating lenses to provide complete collimation.

Prior to use, typical laser devices are collimated. The emitted laser radiation is typically characterized by a full-width at half-maximum of the far field beam intensity pattern in a plane perpendicular to the beam axis. FIG. 1A depicts a cross-sectional view of a conventional single transverse mode edge-emitting semiconductor laser module collimated by a fast axis collimator 101 if it is a broad area laser. Module 101 includes a semiconductor laser 110 disposed on a carrier or substrate 105. Plano-convex collimation lens 120 is substantially aligned with optical beam propagation axis 115. Plano-convex collimation lens 120 has two lensing surfaces, one being a plano lens surface 125 and the other being a convex (aspheric) lens surface 126. Adhesive 130 stands-off lens surface 125 a working distance from emission surface 121. Depending on beam quality asymmetry and associated divergence angles, plano-convex collimation lens 120 may have rotational symmetry about the optical axis or translational symmetry along the slow axis and rotational symmetry along the fast axis. FIG. 1B depicts an isometric view of a conventional laser module 102 including a rotationally symmetric collimation lens 120A in which plano lens surface 125A is circular and convex lens surface 126A is associated with some asphericity. FIG. 1C depicts an isometric view of a conventional laser module 103 including a translationally symmetric collimation lens 120B in which plano lens surface 125 is rectangular and convex lens surface 126B is substantially cylindrical with a fixed or varying radius curvature about a longitudinal axis 116 aligned with a slow optical axis.

One issue with module 101 is that a high angle of incidence on the plano surface can lead to significant optical loss. Another issue with module 101 is that it can be difficult to properly set a correct centration and working distance between the lens and an emission surface as it relies as six-axis alignment while adhesive 130 is cured. Improvements in optical efficiency, and reductions in manufacturing complexity/expense are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
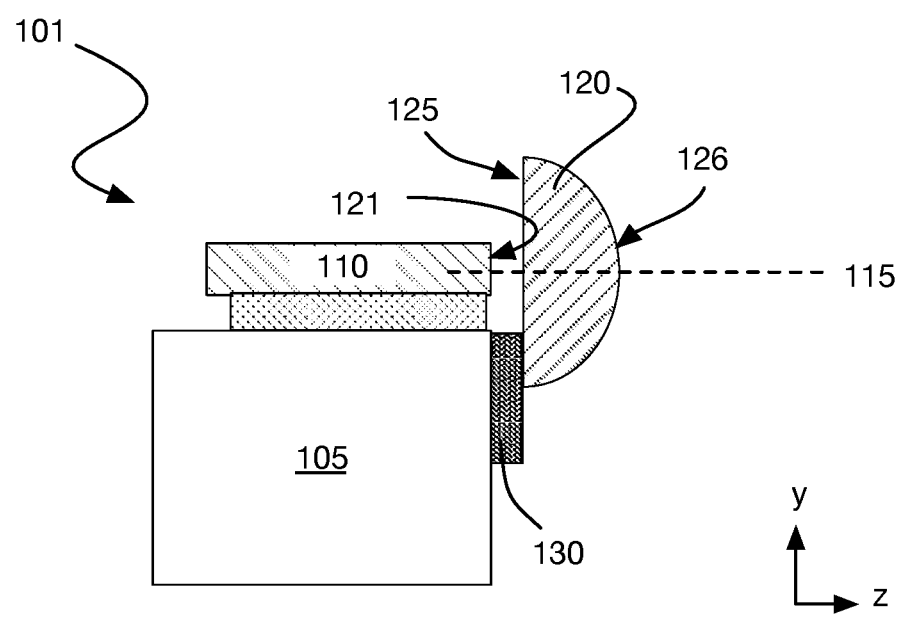
FIG. 1A is a cross-sectional view of a laser module including a conventional plano-convex collimation lens.
Figure 1B:
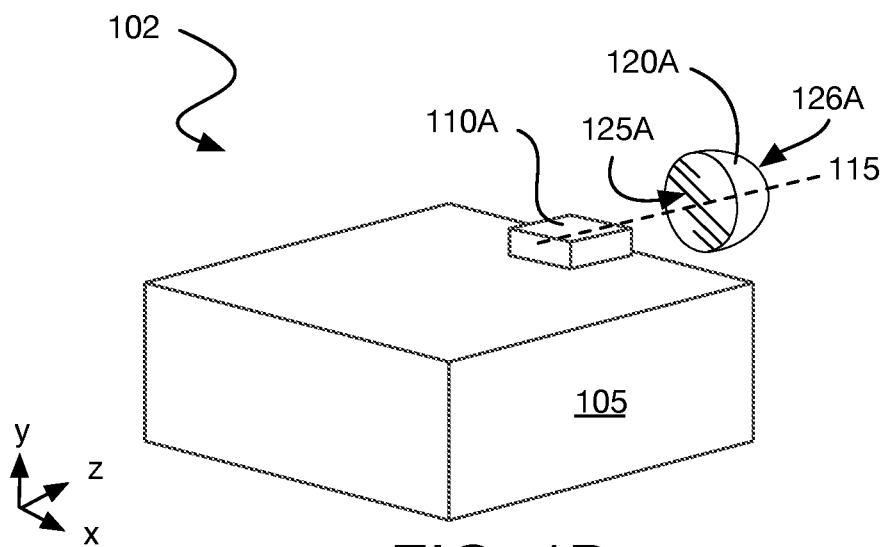
FIGS. 1B and 1C are isometric views of laser modules including a conventional plano-convex collimation lens.
Figure 1C:
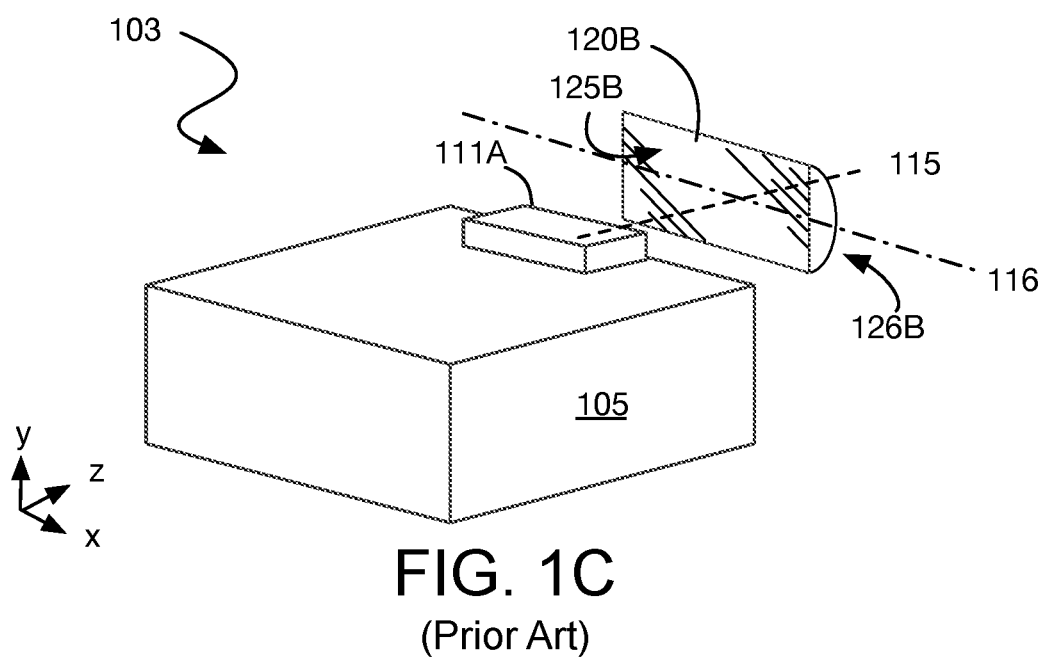

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Laser modules with a meniscus collimating lens are described herein. The lens is positioned with a concave lens surface proximal to an emission surface of the laser. In some mid-IR to long-IR embodiments, the laser emits at a wavelength of at least 3 µm. Depending on the radial (axial) symmetry of the beam emission, a meniscus collimating lens may include a concave-convex curved lens surfaces that are either rotational symmetric or cylindrical to collimate the fast axis. In some embodiments, the meniscus lens material has a refractive index of at least 2.0. The meniscus lens may advantageously provide a reduced beam incidence angle for a given optical mode relative to a plano-convex collimation lens. One or more of the curved lens surfaces may be aspheric to correct spherical aberration. Being closer to the best-form collimating optic, the convex lens surface distal from the emission surface may require less asphericity than would otherwise be required in a plano-convex collimating lens. In some embodiments, a perimeter of the collimating lens has a face-flat that may be disposed directly against a reference surface, such as a surface of the laser or a surface of a package substrate of the laser module, while the concave lens surface is separated from the emission surface.

Figure 2A:
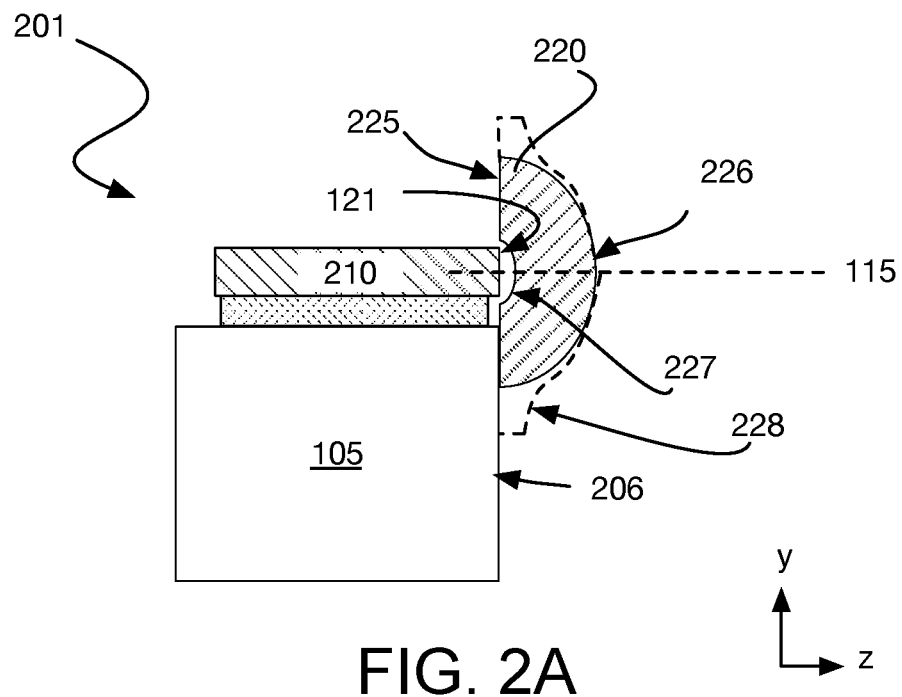
FIG. 2A is a cross-sectional view of a laser module including a meniscus collimation lens, in accordance with some embodiments.

FIG. 2A is a cross-sectional view of a laser module 201 including a meniscus collimation lens 220, in accordance with some embodiments. Laser module 201 includes laser 210 mounted to a module package substrate or carrier 105 such that a laser beam output from the laser 210 is incident on a concave surface of the collimator lens. A housing (not depicted), for example made of a conductive material such as aluminum or copper, may enclose laser module 201 and include a wall opening through which collimated laser light may be output. The housing may further include a housing mounting surface that is configured for receiving substrate 105 upon which one or more lasers 210 may be attached.

Laser 210 may be any laser operable to emit a beam with any wavelength. In some embodiments, laser 210 emits at wavelengths in the mid-IR to long IR band. While laser 210 may comprise a gas, solid-state laser, or fiber laser, in exemplary embodiments laser 210 is a semiconductor laser, such as, but not limited to a QCL or laser diode. Some exemplary laser diodes are operable to emit at a wavelength of at least 3 µm. In a QCL, a gain medium comprising a quantum well stack may be fabricated within a waveguide. The waveguide supports resonant modes which help shape the overall output beam. The waveguide may end at an emission surface or facet 121 where the optical beam is output in a direction substantially normal to the facet surface, propagating along optical beam axis 115. In alternative vertical surface emitting embodiments, optical beam axis may be aligned with the y-axis in FIG. 2A, propagating in a direction opposite package substrate 105.

Semiconductor lasers are often associated with highly divergent beams. This is particularly an issue for those emitting at the wavelengths of the mid-to-long IR band. In some exemplary embodiments, laser 210 emits a beam with full-angle divergence no less than 30°, and potentially between 90-180°. As many laser applications benefit from a collimated beam of planar wavefronts, module 201 advantageously optically collimates a significant portion of the highly divergent output from laser 210 with collimating meniscus lens 220. Beam divergence may also exhibit asymmetry, and for such embodiments meniscus lens 220 is advantageously operable as a fast axis collimator (FAC). If desired, divergence along the slow axis may then be compensated for with a discrete slow axis collimator, external to laser module 201. Although not depicted, laser module 201 may include other components, such as, but not limited to a slow axis collimating lens or a focusing lens for focusing the collimated beam.

In exemplary embodiments, collimating lens 220 is a meniscus lens having a second curved (lensing) surface 227 in addition to curved (lensing) surface 226. Hence, rather than a plano-convex lens, collimating lens 220 is concave-convex. Lens 220 ideally has a linear optical axis passing through both lensing surfaces 226, 227 aligned with optical beam axis 115. In advantageous embodiments, lens 220 is monolithic, single-element lens rather than a lens system that might otherwise include, for example, discrete plano-convex and plano-concave optical elements. In some embodiments, lens 220 is a homogenous bulk material having a refractive index of at least 2.0 for a wavelength of 3 μm. Materials, such as silica (n=1.5) are exceedingly lossy within the mid-to-long IR band. Exemplary materials for lens 220 include crystalline zinc selenide (ZnSe), germanium (Ge), cadmium telluride (CdTe), and various chalcogenide glasses. Exemplary chalcogenides include mixtures of Se, Ge, and antimony. Heterogeneous bulk materials may also be employed, for example having a radial composition gradient modulating the refractive index. For such embodiments, the minimum refractive index is at least 2.0 for a wavelength of 3 μm. In some advantageous embodiments, meniscus lens 220 further includes one or more anti-reflective (AR) coating disposed on at least concave lensing surface 226. The AR coating may be, for example, a quarter-wave single layer or multi-layered stack having thickness of a 1-50 μm, depending on the number of quarter wavelength dielectric pairs required for the necessary AR coating performance.

For the mid-to-long IR band and these relatively high index materials (i.e., >2.0) a meniscus lens may be closer to the best-form lens that most effectively reduces spherical aberration of the beam, optimizing collimation by keeping light rays at the perimeter of the collimating lens aligned with those near the beam axis. By reducing Fresnel reflection and scattering losses of the lens, the optical efficiency of the collimating lens and of the optical train can be greatly increased. With less spherical aberration, relatively reduced asphericity is required in one or more of the two curved lensing surfaces to correct spherical aberration than would otherwise be required for a plano-convex collimation lens. By designing an optical surface that comes closer to the "best form" design the lens is more easily manufacturable and lower cost. While aspheric profiles may take many forms, a typical profile for convex surface 227 is illustrated in FIG. 2A by dashed line 228. Asphericity may be described as an amount of sag in the convex surface deviating from a best-fit spherical surface. For a rotationally symmetric lens for example, a toroidal sag surface profile may be described as:

$$z = \frac{\left(\frac{1}{R}\right)y^2}{1 + \sqrt{1 - \left((1+\kappa)\left(\frac{1}{R}\right)^2 y^2\right)}} + \alpha_3 y^6, \quad (1)$$

where α describes the deviation of the surface from an axially symmetric quadric surface specified by radius of curvature R and conic constant κ.

Figure 2B:
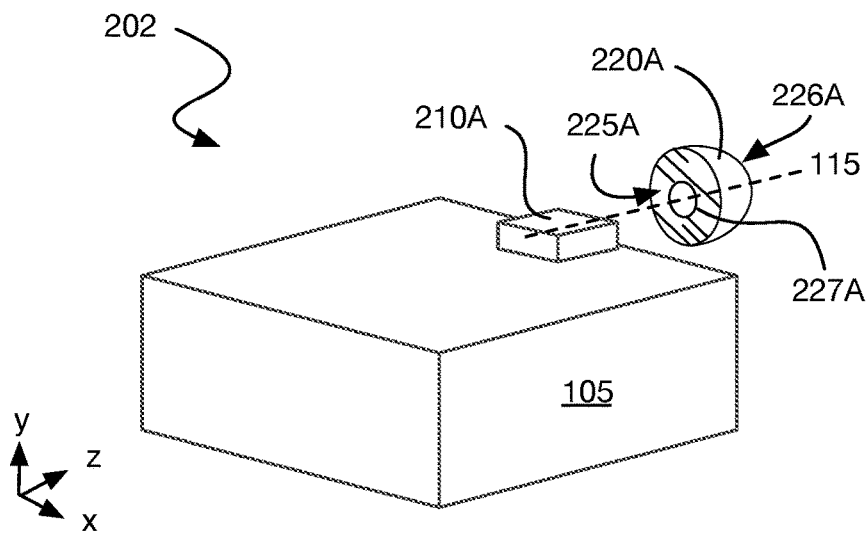
FIGS. 2B and 2C are isometric views of laser modules including a meniscus collimation lens, in accordance with some embodiments.

FIG. 2B is an isometric view of a laser module 202 including a meniscus collimation lens 220A in accordance with some embodiments. Laser 210A emits a beam that is radially (axially) symmetric about beam axis 115. For such radially symmetric beams, collimating lens 220A is generally bowl-shaped with both curved surfaces 226 and 227 being radially symmetric about the optical axis. In some embodiments, curved surfaces 226A, 227A are both spherical. However, for advantageous embodiments with near diffraction-limited performance, at least one of the curved surfaces in collimating lens 220A is aspherical, including a sag component in the surface profile. Radial symmetry may be maintained even with such asphericity. In some advantageous embodiments, only convex curved surface 226A is aspherical while concave surface 227A is spherical, reducing complexity of lens manufacture. In some other embodiments, only concave curved surface 227 is aspherical while convex curved surface 226A is spherical. In still other embodiments however, both curved surfaces 226A, 227A are aspherical.

Figure 2C:
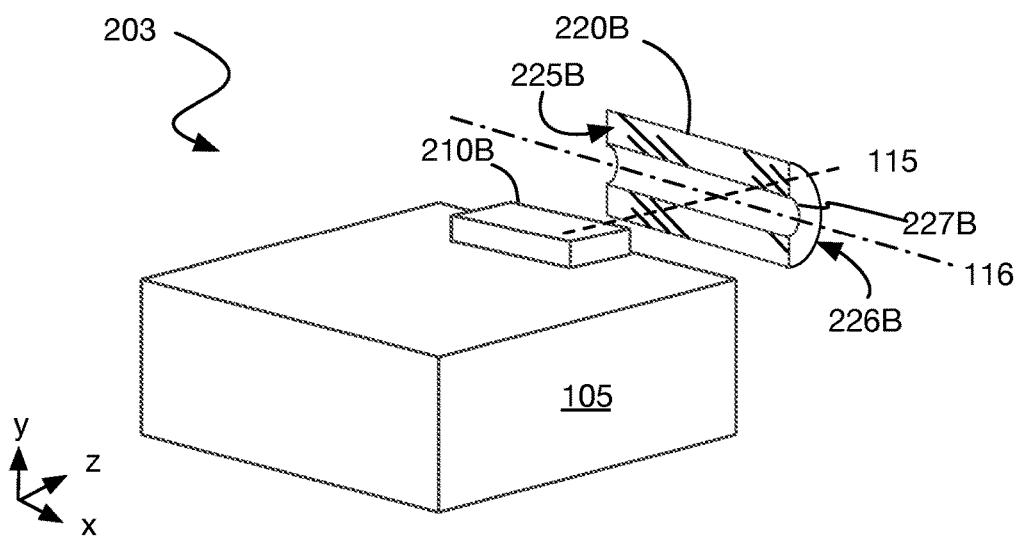

FIG. 2C is an isometric view of laser module 203 including a meniscus fast axis collimation (FAC) lens 220B in accordance with some embodiments. Laser 210B emits a beam that is radially asymmetric, characterized as having both a slow divergence axis and fast divergence axis. For such embodiments, collimating lens 220B is generally a translation of collimating lens 220A along a longitudinal axis 116 ideally aligned with the slow optical axis of laser 210B. Where there is no sag in the lensing surface profiles, lens 220B forms a semi-annular, cylindrical section with curved surfaces 226B, 227B each having a constant radius of curvature about longitudinal axis 116. However, for advantageous embodiments providing near diffraction-limited performance, at least one of the curved surfaces 226B, 227B is has a radius of curvature that varies with angular position about longitudinal axis 116 which may also be quantified as a degree of asphericity. In some embodiments, at least one of curved surfaces 226B, 227B has a constant radius of curvature about longitudinal axis 116. In some advantageous aspheric FAC lens embodiments, only convex curved surface 226B is aspheric having a radius of curvature that varies with angular position about longitudinal axis 116 while concave curved surface 227B has a constant radius of curvature. In some other aspheric FAC embodiments, both surfaces 226A, 227A have a varying radius of curvature about longitudinal axis 116.

Figure 3A:
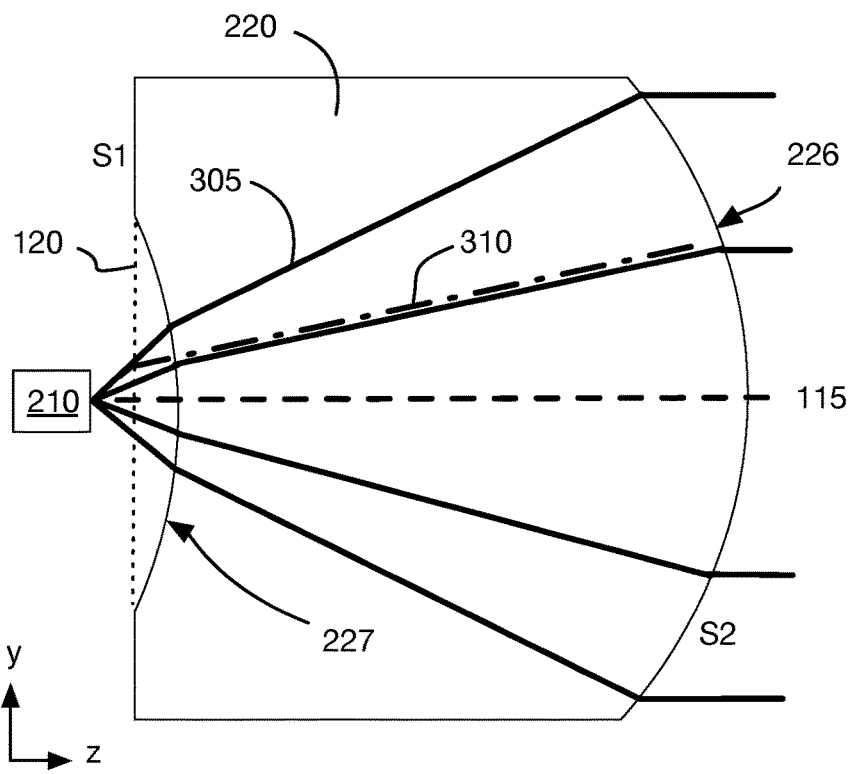
FIG. 3A is a cross-sectional view illustrating a reduction in incident angle for modules employing a meniscus collimation lens in accordance with some embodiments relative to a conventional plano-convex collimation lens.
Figure 3B:
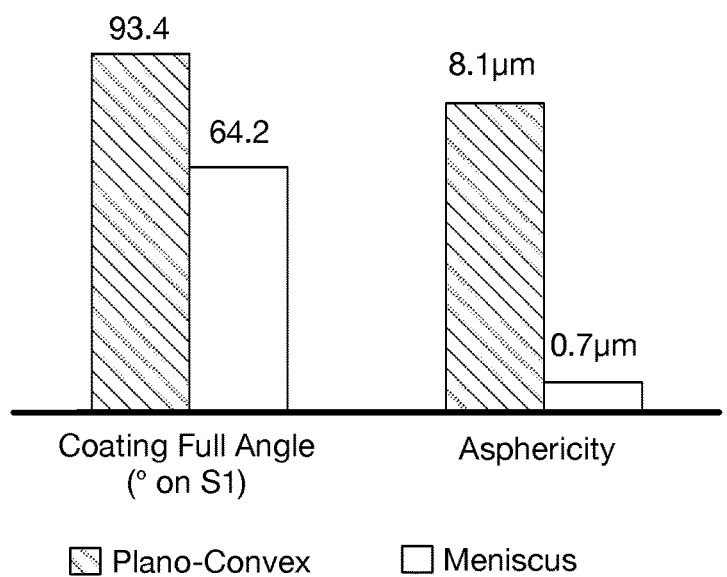
FIG. 3B is a bar graph illustrating effects of employing a meniscus collimation lens in a laser module, in accordance with some embodiments.

A meniscus lens in accordance with embodiments offers lower optical loss relative to a plano-convex optic by reducing both absorption and a reflection loss. Models generated by the inventors have indicated that a meniscus lens may be as little as one-half the thickness of a plano-convex lens and achieve the same level of collimation. For lens materials that are lossy, either because of bulk absorption or inclusions, this reduction in lens thickness can translate into a significant gain in beam transmission. Reflection loss may also be reduced as a result of lower angles of incidence associated with the meniscus collimation lens. FIG. 3A is a cross-sectional view illustrating a reduction in incident angle for modules employing a meniscus collimation lens in accordance with some embodiments. As illustrated, a ray emitted from laser 210 at a given divergence angle will have a higher angle of incidence to the lens surface S1 if S1 is the hypothetical planer surface 120 (dotted line in FIG. 3A) normal to beam axis 115 than if S1 is the concave curved surface 227. Fresnel reflection loss will therefore be lower for concave curved surface 227 at a given divergence angle. This effect is further illustrated in FIG. 3B where the full-angle over which reflections occur on surface S1 is shown for both a plano-convex lens with the hypothetical planer surface 120 and a meniscus lens with the concave curved surface 227. The lower coating full-angle for the meniscus lens translates into a narrower band requirement for the AR coating. Optical loss associated with an AR coating designed for the smaller coating full-angle for the meniscus less, as applied to concave curved surface 277, will be less than for an AR coating designed for the wider full-angle of reflections associated with a plano S1 surface.

In some exemplary embodiments, a meniscus collimating lens further comprises a face-flat adjacent to the concave curved surface. A face-flat 225 is illustrated in FIG. 2A, and further shown for face-flats 225A and 225B in FIG. 2B and 2C, respectively, for collimation lenses having either rotational or translational symmetry. In some embodiments, the meniscus lens face-flat is in direct contact with a surface of a lens holder, a surface of a substrate around an active emitting region of the diode, or a surface of module substrate. FIG. 2A, for example, illustrates direct contact between module substrate 105 and face-flat 225. In other embodiments, the lens face-flat is in direct contact with non-emitting portions of a laser, for example contacting an edge facet or top surface of a semiconductor laser. Even with face-flat 225 in direct contact with module substrate surface 206, and/or with face-flat 225 in direct contact with an edge facet of the substrate of diode laser 210, concave curved surface 227 remains spaced-apart from emission surface to the correct working distance of the lens 121. As such, a desired working distance for collimating meniscus lens 220 may be established relative to emission surface 121 merely by landing the collimation lens face-flat on a reference surface that that has a well-controlled position relative to the emission surface (e.g., a non-emitting portion of an edge facet of the laser diode).

In embodiments illustrated in FIG. 2B, curved concave lens surface 227 comprises a divot within face-flat 225. Face-flat 225A then provides a rotationally symmetric flat surface around adjacent to concave lens surface 227A, which may be landed upon surfaces of laser 210A (or substrate 105) to properly stand-off curved concave lens surface 227A from the laser emission surface in the z-dimension, and also properly orient the lens optical axis to beam axis 115 (e.g., in the x and y dimensions). In embodiments illustrated in FIG. 2C, curved concave lens surface 227B comprises a trough within face-flat 225B. Here too, face-flat 225B provides one or more flat perimeter surface adjacent to curved concave lens surface 227B, which may land upon surfaces of laser 210B (or substrate 105) to stand-off curved concave lens surface 227B from the laser emission surface in the z-dimension.

Figure 4:
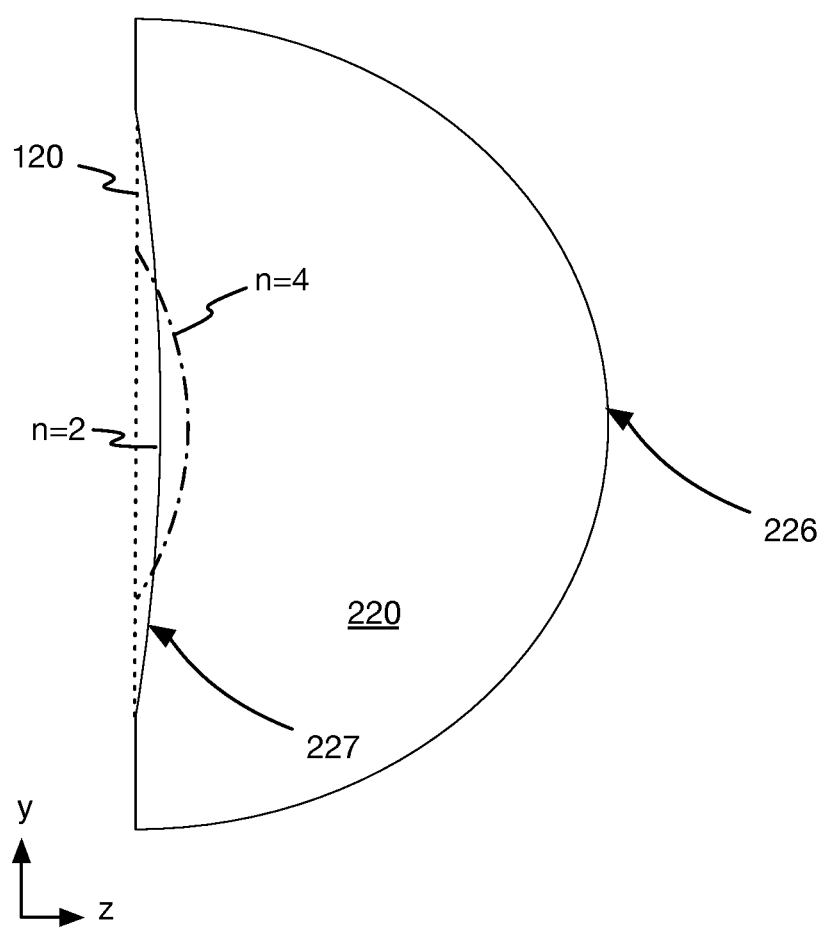
FIG. 4 illustrates meniscus collimation lens curvature as a function of their refractive index, in accordance with some embodiments.

Lens thickness (e.g., z-dimension) may be designed (e.g., increased) for improved collimation, or (e.g., reduced) for lower optical loss. The radius of curvature of at least the convex lensing surface is generally large (e.g., an order of magnitude or larger than IR band of the laser). In some embodiments, the radius of curvature of the concave lensing surface is also large (e.g., an order of magnitude or larger than emission band of the laser). Curvature of one or more of the convex and concave lensing surfaces may vary as a function of refractive index of the lens. For example, FIG. 4 illustrates meniscus collimation lens for materials of different refractive index, in accordance with some embodiments. As illustrated, radius of curvature of concave surface 227 decreases with increasing refractive index. For a lens with a refractive index of 2 (ZnSe) and a focal length of 600 μm for example, the concave radius R in Eq. (1) may be −337.9 μm for concave curved surface 227, and −666.5 μm for convex curved surface 226 with a conic constant of −233.9 μm. For a lens with refractive index of 4 (Ge) and focal length of 600 μm for example, the concave radius R in Eq. (1) is may be −402.6 μm for concave curved surface 227 and −946.7 μm for convex curved surface 226 with a conic constant of −163.6 μm.

Figure 5:
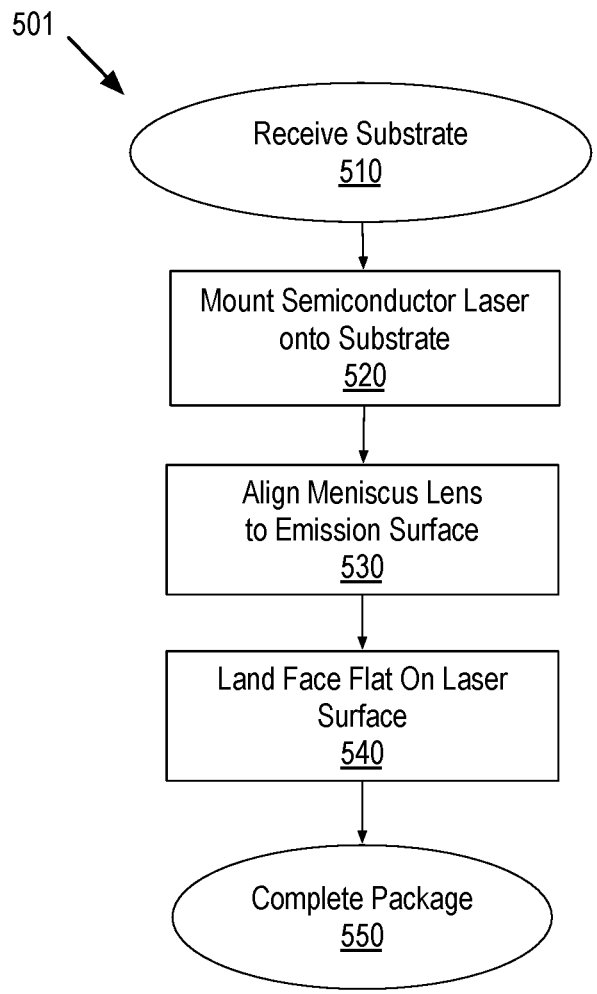
FIG. 5 is a flow diagram illustrating a method of assembling a laser module including a meniscus collimation lens, in accordance with some embodiments.

FIG. 5 is a flow diagram illustrating a method 501 for assembling a laser module including a meniscus collimation lens, in accordance with some embodiments. Method 501 may be practiced to assemble any of the laser modules described herein, for example. Method 501 begins at operation 510 where any module package substrate, carrier, or mount known to be suitable for the application is received. At operation 520, a semiconductor laser, such as but not limited to, a mid-to-long IR QCL is mounted to the substrate using any known techniques. For example, the QCL may be soldered or die bonded to a copper, ceramic, or other substrate with good thermal properties. For edge-emitting embodiments, the laser may be affixed to substrate such that an emission edge of the laser substrate is slightly proud of a substrate edge (e.g., by 0-100 μm). At operation 530, a meniscus lens is aligned to an emission surface of the laser with a concave curved surface proximal to the emission surface and convex curved surface distal from the emission surface. In some embodiments a pick-and-place machine, or the like, with a six-axis stage aligns the optical axis with the emission surface. At operation 540, a controlled force is applied to land a face-flat of the meniscus lens in direct contact with the laser surface. In advantageous embodiments, no adhesive or other spacer material is disposed between the face-flat and laser surface. In other embodiments, a controlled force is applied to land a face-flat of the meniscus lens in direct contact with the substrate, spacer, or lens holder providing a reference surface that may be adjustable relative to an emission surface of the laser. A fastening means, such as adhesive (e.g., UV-curable epoxy), solder, or welding is then applied, for example about a perimeter of the meniscus lens to affix the lens in place.

Figure 6:
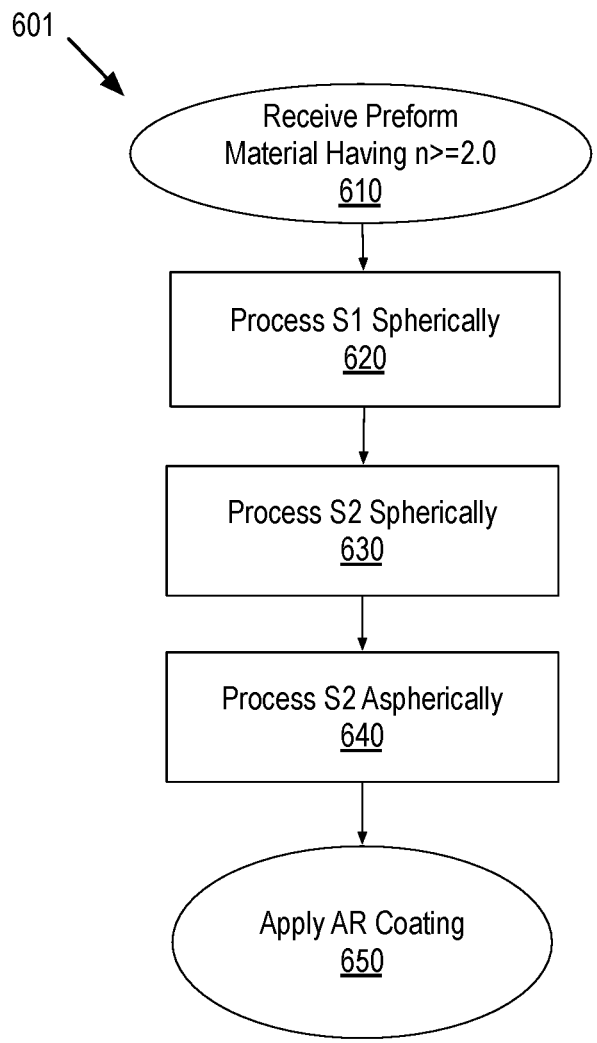
FIG. 6 is a flow diagram illustrating a method of fabricating a meniscus collimation lens, in accordance with some embodiments.

FIG. 6 is a flow diagram illustrating a method 601 for fabricating a meniscus collimation lens, in accordance with some embodiments. Method 601 may be practiced to fabricate any of the meniscus collimation lenses described herein, for example. Method 601 begins at operation 610 where a lens preform is received. The lens preform may be a material having a refractive index of at least 2.0, such as, but not limited to, any of the materials described elsewhere herein. Lensing surfaces are then formed in the preform. In some advantageous embodiments, the concave (S1) and convex (S2) surfaces are first processed spherically at operations 620, 630. The radii of curvature may be formed (e.g., according to Eq. (1)) on both concave and convex surface concurrently, for example with a pin molding process if the preform. Molding processes are possible where the preform material is a chalcogenide glass for example. Alternatively, the radii of curvature may be formed on each of the concave and convex surfaces serially, for example with a six-axis grinding apparatus. Such a grinding process is suitable for non-moldable perform materials, such as Ge crystal, or where highest accuracy is desired. Method 601 continues at operation 640 where one or more of the meniscus lens surfaces are then aspherically processed. Operation 640 may entail, for example, one or more of single point diamond turning (SPDT) and surface ablation. Because operation 640 is relatively expensive with potentially high discard rates, in some advantageous embodiments only the convex (S2) surface is processed at operation 640. As described above, with a meniscus lens closer to best-form, little correction of spherical aberration may be required even on the convex lensing surface, thereby reducing processing complexity and/or processing time associated with operation 640 relative to what would be required to correct spherical aberration in a plano-convex lens. In embodiments where cost is of primary concern, operation 640 may be skipped with the final lens shape then completely described by only the radii of curvature associated with spherical processing operations 620, 630. Method 601 is completed at operation 650 where an AR coating is applied to at least the curved concave lens surface. The completed lens may then be assembled into a laser module, for example through the practice of method 501.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. For example, while various embodiments where described in the context of a single collimation lens, it is noted that arrays of such lenses may be arranged for collimation of QCL laser (mini)bars, etc.

It will be recognized that the invention is not limited to the embodiments so described, but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A laser module, comprising:
   a laser on a substrate, the laser to emit a divergent optical beam from an emission surface, wherein the optical beam has a divergence full-angle of at least 30° from the emission surface; and
   a meniscus collimating lens affixed within the module relative to the emission surface and optically coupled to receive the divergent optical beam, wherein the collimating lens comprises a concave curved surface proximal to the emission surface and a convex curved surface distal from the emission surface, and wherein the concave curved surface is spaced apart from the emission surface by less than 500 µm.

2. The laser module of claim 1, wherein:
   the laser emits at a wavelength of at least 3 µm; and
   the collimating lens comprises a monolithic material have a refractive index of at least 2.0.

3. The laser module of claim 1, wherein:
   the divergent optical beam is radially symmetric about an optical axis; and
   at least one of the concave and convex curved surfaces is spherical.

4. The laser module of claim 3, wherein at least one of the concave and convex curved surfaces is aspherical.

5. The laser module of claim 4, wherein the concave curved surface is spherical and the convex curved surface is aspherical.

6. The laser module of claim 1, wherein:
   the divergent optical beam has a fast axis and a slow axis; and
   the concave and convex curved surfaces each have a radius of curvature about a longitudinal axis aligned with the slow axis.

7. The laser module of claim 1, wherein the meniscus collimating lens further comprises a face-flat adjacent to the concave curved surface.

8. The laser module of claim 7, wherein the face-flat is in direct contact with the laser and the concave curved surface is spaced apart from the emission surface.

9. The laser module of claim 7, wherein the face-flat is in direct contact with a surface of the substrate.

10. The laser module of claim 8, wherein:
    the laser comprises a semiconductor laser;
    the emission surface comprises the edge facet; and
    the face-flat is in direct contact with the edge facet.

11. A method of assembling a laser module, the method comprising:
    mounting the semiconductor laser of claim 1 to the substrate;
    aligning an optical axis of the meniscus collimation lens to an optical axis of the laser; and
    landing a face-flat of the meniscus lens on a surface of the laser or substrate to space apart the concave curved surface of the lens from the emission surface of the laser.

12. The method of claim 11, wherein:
    the aligning comprises positioning the meniscus lens relative to the laser with a six-axis stage to have the concave curved lens surface proximal to the emission surface and a convex curved lens surface distal from the emission surface; and
    landing the face-flat further comprises contacting flat surface of the meniscus lens surrounding the concave curved surface with a surface on the laser adjacent to the emission surface.

13. The method of claim 11, wherein:
    the semiconductor laser is to emit an optical beam radially symmetric about the optical axis; and
    at least one of the concave and convex curved surfaces is spherical.

14. The method of claim 13, wherein at least one of the concave and convex curved surfaces is aspherical.

15. The method of claim 14, wherein the concave curved surface is spherical and the convex curved surface is aspherical.

16. The method of claim 11, further comprising fabricating the meniscus lens, the fabricating further comprising:
    forming a concave surface with a fixed radius of curvature into a first side of a preform material having a refractive index of at least; and
    forming a convex surface with a varying radius of curvature into a second side of the preform material.

17. The method of claim 16, wherein the spherical processing comprises at least one of molding and turning.

18. A laser module, comprising:
    a package substrate;
    a semiconductor laser disposed on the substrate and operable to emit an optical beam with a divergence full-angle of at least 90° from an emission surface; and
    a meniscus collimating lens comprising a monolithic material having a refractive index of at least 2.0, with a concave lens surface spaced apart from the emission surface by less than 500 µm, and a face-flat of the lens disposed against the laser or substrate.

19. The laser module of claim 18, wherein the concave curved surface is spherical and the lens further comprises an aspherical convex curved surface.

* * * * *